(12) United States Patent
Takaya et al.

(10) Patent No.: US 8,215,944 B2
(45) Date of Patent: Jul. 10, 2012

(54) IMPRINTING DEVICE AND IMPRINTING METHOD

(75) Inventors: Yoshiaki Takaya, Ichihara (JP); Yuji Hashima, Ichihara (JP); Yoshihisa Hayashida, Ichihara (JP); Hirosuke Kawaguchi, Kawasaki (JP); Satoru Tanaka, Kawasaki (JP); Akihiko Kanai, Kawasaki (JP); Kazuaki Uehara, Kawasaki (JP)

(73) Assignee: Scivax Corporation, Kanagawa (JP)

( * ) Notice: Subject to any disclaimer, the term of this patent is extended or adjusted under 35 U.S.C. 154(b) by 6 days.

(21) Appl. No.: 12/810,557

(22) PCT Filed: Dec. 25, 2008

(86) PCT No.: PCT/JP2008/003953
§ 371 (c)(1),
(2), (4) Date: Sep. 17, 2010

(87) PCT Pub. No.: WO2009/081586
PCT Pub. Date: Jul. 2, 2009

(65) Prior Publication Data
US 2011/0024948 A1 Feb. 3, 2011

(30) Foreign Application Priority Data
Dec. 26, 2007 (JP) .................... 2007-335093

(51) Int. Cl.
*A01J 21/00* (2006.01)
*A01J 25/12* (2006.01)
*B28B 11/08* (2006.01)
*B29C 35/04* (2006.01)
(52) U.S. Cl. .............. 425/385; 425/388; 425/405.1; 425/389; 264/293; 264/401
(58) Field of Classification Search .......... 264/293, 264/401; 425/385, 388, 389, 405.1
See application file for complete search history.

(56) References Cited

U.S. PATENT DOCUMENTS
2006/0006580 A1  1/2006 Olsson et al.
(Continued)

FOREIGN PATENT DOCUMENTS
JP    9-240125 A    9/1997
(Continued)

OTHER PUBLICATIONS

International Search Report dated Mar. 24, 2009 in corresponding international patent application No. PCT/JP2008/003953, with English translation thereto, 7 pages.

(Continued)

*Primary Examiner* — Christina Johnson
*Assistant Examiner* — Michael Piery
(74) *Attorney, Agent, or Firm* — Maier & Maier, PLLC (57) ABSTRACT

The present invention provides an imprinting device and an imprinting method which can uniformly apply pressure between a mold and a molding object and which can increase and decrease a temperature at a fast speed. An imprinting device is for transferring a pattern on a mold to a film molding object and comprises a stage for holding the mold, a pressurizing-chamber casing which configures a pressurizing-chamber together with the molding object, sealing means which airtightly seals a space between the pressurizing-chamber casing and the molding object, opening and closing means which opens and closes the space between the pressurizing-chamber casing and the molding object, pressurizing means which adjusts atmospheric pressure in the pressurizing-chamber, heating means which heats either one of or both of the mold and the molding object, and degassing means which eliminates any gas present between the mold and the molding object.

6 Claims, 5 Drawing Sheets

U.S. PATENT DOCUMENTS

| | | |
|---|---|---|
| 2006/0105571 A1 | 5/2006 | Colburn et al. |
| 2006/0275018 A1 | 12/2006 | Chae |
| 2007/0212522 A1 | 9/2007 | Heidari et al. |

FOREIGN PATENT DOCUMENTS

| | | |
|---|---|---|
| JP | 2006-13453 A | 1/2006 |
| JP | 2008-230027 A | 10/2008 |
| JP | 2008-288673 A | 11/2008 |
| WO | 0207199 A1 | 1/2002 |
| WO | 2007/067469 A2 | 6/2007 |

OTHER PUBLICATIONS

Japanese Office Action to corresponding to Japanese Patent Application No. 2007-335093 to include the English Translation and Certification thereto.

Extended European Search Report and Written Opinion dated May 19, 2011 from corresponding European Patent Application No. 08863432.4-6 pages.

Applicants' response to the Communication pursuant to Rules 70(2) and 70a(2) dated Nov. 7, 2011-9 pages.

IMPRINTING DEVICE AND IMPRINTING METHOD

RELATED APPLICATIONS

This application is the 371 U.S. national stage application which claims priority under 35 U.S.C. §119 to international patent application No.: PCT/JP2008/003953, filed on Dec. 25, 2008, which claims priority to Japanese patent application No.: 2007-335093, filed on Dec. 26, 2007, the disclosures of which are incorporated by reference herein in their entireties.

TECHNICAL FIELD

The present invention relates to an imprinting device and an imprinting method with high throughput.

BACKGROUND ART

Recently, thermal nanoimprinting technologies are getting attention as technologies of forming an ultra-fine pattern in a micro order or in a nano order. According to such technologies, a molding object like a substrate or a film formed of a resin with thermal plasticity is heated to a temperature equal to the glass transition temperature of the resin or higher, and a fine pattern is pressed against the molding object, thereby transferring the pattern.

According to such nanoimprinting technologies, parallelism between the mold and the molding object and flatness are important factors. If the mold and the molding object are not parallel to each other, pressure applied thereto becomes non-uniform, so that stress may be applied locally and the molding object may be deformed or damaged, resulting in transfer failure of the pattern.

In order to overcome such a problem, conventionally, there are proposed a device which has an elastic member arranged at the rear of the mold (see, for example, patent literature 1), and a device which hydraulically pressurizes the mold via a flexible film (see, for example, patent literature 2).

Patent Literature 1: International Publication No. WO2007/049530

Patent Literature 2: International Publication No. WO01/042858

DISCLOSURE OF INVENTION

Problem to be Solved by the Invention

According to those devices, however, a problem originating from the parallelism between the mold and the molding object and the flatness is not sufficiently resolved. Moreover, conventional devices have a stage or the like holding the molding object between a heater and the molding object, and large amount of heat is requisite for this, so that it takes a lot of time for heating and cooling. Such problem becomes further noticeable as the device becomes large.

Therefore, it is an object of the present invention to provide an imprinting device and an imprinting method which can uniformly apply pressure between a mold and a molding object and which can increase/reduce a temperature at a fast speed.

Means for Solving the Problem

To achieve the object, a first imprinting device of the present invention transfers a pattern on a mold to a film molding object, and the imprinting device comprises: a stage for holding the mold; a pressurizing-chamber casing which configures a pressurizing chamber together with the molding object; sealing means which airtightly seals a space between the pressurizing-chamber casing and the molding object; opening/closing means which opens/closes the space between the pressurizing-chamber casing and the molding object; pressurizing means which adjusts atmospheric pressure in the pressurizing chamber; and heating means which heats either one of or both of the mold and the molding object.

A second imprinting device of the present invention transfers a pattern on a film mold to a molding object, and the imprinting device comprises: a stage for holding the molding object; a pressurizing-chamber casing which configures a pressurizing chamber together with the mold; sealing means which airtightly seals a space between the pressurizing-chamber casing and the mold; opening/closing means which opens/closes the space between the pressurizing-chamber casing and the mold; pressurizing means which adjusts atmospheric pressure in the pressurizing chamber; and heating means which heats either one of or both of the mold and the molding object.

In this case, it is preferable that the imprinting device should further comprise degassing means which eliminates a gas present between the mold and the molding object. Moreover, the heating means may perform heating by irradiation of electromagnetic waves, or may supply a gas heated at a predetermined temperature to the pressurizing-chamber casing. Furthermore, it is preferable that the imprinting device should further comprise cooling means which cools the molding object.

In the second imprinting device, the mold may be a film mold used at a predetermined molding temperature, the film mold comprising a base layer formed of a thermoplastic resin and a hard layer formed of a material harder than the thermoplastic resin at the molding temperature and formed at a molding face side of the base layer.

A first imprinting method of the present invention transfers a pattern on a mold to a film molding object, and comprises a step of: directly pressing the molding object against the mold by a gas.

A second imprinting method of the present invention transfers a pattern on a film mold to a molding object, and comprises a step of: directly pressing the mold against the molding object by a gas.

In this case, it is preferable that a gas present between the mold and the molding object should be eliminated before the pattern on the mold is transferred. Moreover, either one of or both of the mold and the molding object can be heated by irradiation of electromagnetic waves or by a gas at a predetermined temperature.

Effect of the Invention

According to the present invention, at least either one of the mold or the molding object to be used is a flexible film, and is directly pressed by a gas, so that pressure can be uniformly applied between the mold and the molding object, thereby enabling precise pattern transfer.

Moreover, because any intervening member present between the mold or the molding object and the heating means can be eliminated, the molding object can be subjected to fast-speed temperature increasing/reduction by irradiation of electromagnetic waves or by a gas at a predetermined temperature, thereby improving the throughput.

DESCRIPTION OF REFERENCE NUMERALS

1 Imprinting device
2 Imprinting device
11 Stage
12 Pressurizing chamber
13 Pressurizing-chamber casing
14 Sealing means
15 Opening/closing means
16 Pressurizing means
17 Heating means
18 Degassing means
100 Mold
101 Base layer
102 Hard layer
200 Molding object

BEST MODE FOR CARRYING OUT THE INVENTION

An explanation will be given of embodiments of the present invention with reference to the accompanying drawings.

First Embodiment

Figure 1:
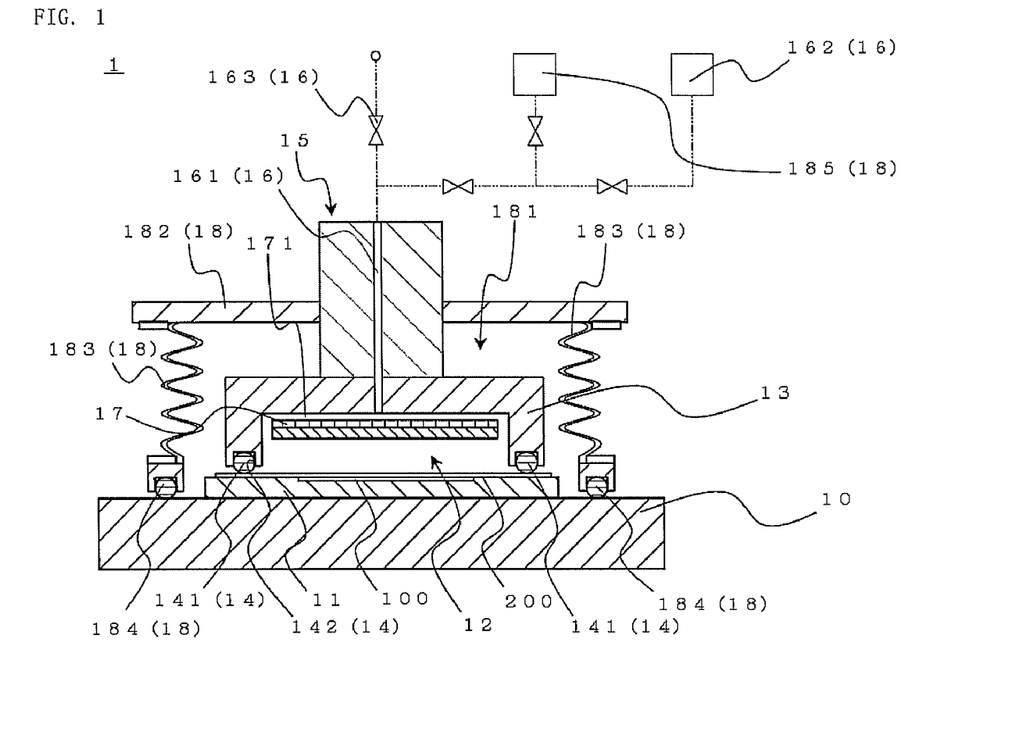
FIG. 1 is a schematic cross-sectional view showing a first imprinting device of the present invention.

As shown in FIG. 1, a first imprinting device 1 of the present invention is an imprinting device for transferring a pattern on a mold 100 to a film-like molding object 200, and mainly comprises a stage 11 for holding the mold 100, a pressurizing-chamber casing 13 which configure a pressurizing chamber 12 together with the molding object 200, sealing means 14 which airtightly seals a space between the pressurizing-chamber casing 13 and the molding object 200, opening/closing means 15 which opens/closes the space between the pressurizing-room chamber 13 and the molding object 200, pressurizing means 16 for adjusting an atmospheric pressure inside the pressurizing chamber 12, and heating means 17 which heats the molding object 200. Moreover, it is preferable that the imprinting device should further have degassing means 18 which expels any gas from a space between the mold 100 and the molding object 200.

The stage 11 is not limited to any particular one as far as it can hold the mold 100, but for example, is formed in a planar shape having a plane for holding the mold 100 larger than the mold 100, or has a recess which is formed in such a plane with a depth substantially equal to the thickness of the mold and which can retain the mold 100 thereinside. The material of the stage is not limited to any particular one as far as it has pressure resistance and heat resistance so as to withstand pressure and heat at the time of molding, but it is preferable that such material should have a thermal expansion coefficient similar to that of the mold 100. For example, when the mold 100 is formed of nickel, the nickel-made stage 11 can be used. Moreover, it is preferable if the mold 100 and the stage 11 are integrally formed together in order to suppress any generation of unnecessary transfer mark on the molding target 200. For example, according to the conventional technologies, a pattern is formed by electroforming, and only the patterned part is cut out and used, but such patterned part can be used directly as it is without being cut out. Moreover, a holding tool for holding the molding object 200 may be additionally provided.

The pressurizing-chamber casing 13 is formed in a cylindrical shape with an opened face, and configures the pressurizing chamber 12 which is a sealed space as the opened face is closed by the molding object 200. The opened face is so formed as to be larger than at least a pattern area to be transferred to the molding object 200. The material of the pressurizing-chamber casing 13 is not limited to any particular one as far as it has pressure resistance and heat resistance so as to withstand pressure and heat at the time of molding, and for example, an iron material like carbon steel or a metal like SUS can be used.

The sealing means 14 airtightly allows the pressurizing-chamber casing 13 and the molding object 200 airtightly contact with each other in order to make the pressurizing chamber 12 closed. For example, as shown in FIG. 1, an O-ring 141 is prepared as the sealing means 14, a recessed groove 142 shallower than the diameter of the cross section of the O-ring is formed in an end part of a side wall of the pressurizing-chamber casing 13, and the O-ring 141 is fitted into the groove 142. Accordingly, the molding object 200 is held between the pressurizing-chamber casing 13 and the stage 11, and the pressurizing-chamber casing 13 and the molding object 200 can airtightly contact with each other, so that the pressurizing chamber 12 can be airtightly closed. Moreover, even if there is an inclination between the pressurizing-chamber casing 13 and the molding object 200, when such parallelism is within the collapsible range of the O-ring 141, the pressurizing chamber 12 can be surely closed.

The opening/closing means 15 opens/closes the pressurizing chamber 12 by causing the pressurizing-chamber casing 13 and the molding object 200 to move close or to move apart relative to each other, and for example, a system having a hydraulic or pneumatic cylinder moving the pressurizing-chamber casing 13, or a system having an electric motor and a ball screw moving the pressurizing-chamber casing may be used.

The pressurizing means 16 is not limited to any particular one as far as it can adjust atmospheric pressure in the pressurizing chamber 12 up to pressure which enables transfer of a pattern on the mold 100 to the molding object 200, and for example, a pressurizing-chamber inlet/outlet path 161 is connected to the pressurizing-chamber casing 13, and a gas, such as air or an inactive gas is supplied to or expelled from the pressurizing chamber 12 through the pressurizing-chamber inlet/outlet path 161. A cylinder 162 (see FIG. 1) containing compressed gas thereinside or a pressurizing pump can be used to supply such gas. Moreover, such gas can be expelled by opening/closing of a degassing valve 163. Note that a safety valve or the like may be additionally provided as needed.

The heating means 17 is not limited to any particular one as far as it can heat either one of or both of the mold 100 and the molding object 200 to a temperature equal to the glass transition temperature of the molding object or higher, or, a temperature equal to the melting temperature or higher, and for example, a heater is provided at the stage 11 side to heat the mold 100 and the molding object 200 from the stage 11 side. Moreover, one provided in the pressurizing chamber 12 and heating the mold 100 or the molding object 200 by irradiation with electromagnetic waves like far infrared rays may be used. For example, a ceramic heater or a halogen heater provided at the pressurizing chamber 12 side of the pressurizing-chamber casing 13 may be used. According to such a structure, unlike the conventional devices, because there is no intervening member like the stage 11 or a film between the heating means 17 and the molding object 200, the thermal capacity can be reduced, and the mold object 200 can be heated at a fast speed with minimal heat quantity. This also enables fast-speed cooling. Moreover, the gas supplied by the pressurizing means may be heated beforehand and the molding object may be heated by such heated gas. Needless to say, the heating means 17 may be a combination of such structures. Note that a heat insulating material 171 may be provided between the pressurizing-chamber casing 13 and the heating means 17. Moreover, the temperature of the mold 100 and that of the molding object 200 may be detected by temperature detecting means like a thermocouple sensor, and the heating means 17 may be controlled by a control means (not illustrated) like a temperature controller to adjust the temperature.

The degassing means 18 eliminates any gas present between the mold 100 and the molding object 200. The reason why it is preferable to have the degassing means 18 is that if any gas is present between the mold 100 and the molding object 200, it becomes difficult to presses the mold 100 and the molding object 200 against each other and heating becomes nonuniform, resulting in a transfer failure. As an example of the degassing means 18, for example, a vacuum chamber 181 which contains at least the mold 100 and the molding object 200 thereinside is formed, and the interior of the vacuum chamber 181 is subjected to pressure reduction to eliminate any gas present between the mold 100 and the molding object 200.

The vacuum chamber 181 comprises, for example, a ceiling member 182 which covers the top of the pressurizing-chamber casing 13, bellows 183 so provided as to be hung on the ceiling member 182 and to cover the side of the pressurizing-chamber casing 13, a seal member 184 which seals a space between the bellows 183 and the stage 11 or a base 10 where the stage 11 is mounted, and a vacuum pump 185 which evacuates any gas in the vacuum chamber 181 through a vacuum-chamber inlet/outlet path. The seal member 184 is fitted in a recessed groove formed in the bellows 183 at the stage 11 side. It is appropriate if the vacuum pump is capable of reducing the pressure of the vacuum chamber 181 to a condition in which no transfer failure occurs when the molding object 200 is pressed against the mold 100. The ceiling member 182 is so formed as to be movable by the opening/closing means 15. It is needless to say that the ceiling member 182, the bellows 183, and the seal member 184 must have strength capable of withstanding external force under a vacuum condition.

Figure 2:
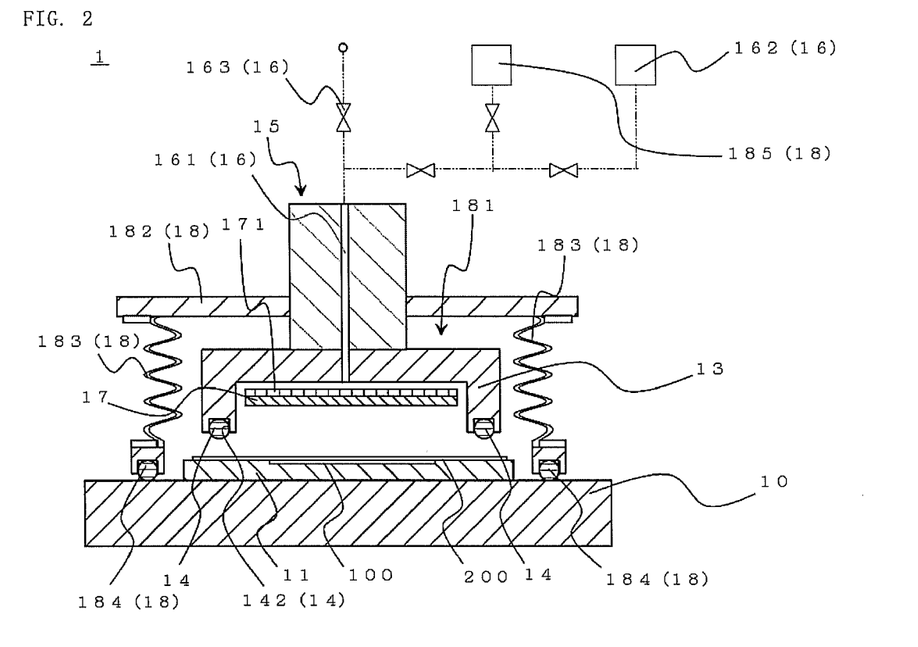
FIG. 2 is a schematic cross-sectional view showing the imprinting device of the present invention with a vacuum chamber being formed.

As shown in FIG. 1, the above-explained pressurizing-chamber inlet/outlet path may serve as the vacuum-chamber inlet/outlet path in common. In this case, as shown in FIG. 2, first, with the pressurizing chamber 12 being opened, gases in the vacuum chamber 181 and the pressurizing chamber 12 are evacuated to eliminate any gas present between the mold 100 and the molding object 200. Next, as shown in FIG. 1, the pressurizing chamber 12 is closed by the opening/closing means 15, gas is supplied to the pressurizing chamber 12 and then the molding object 200 is pressed against the mold 100.

The imprinting device may further comprise cooling means. The cooling means is not limited to any particular one as far as it can cool down the mold 100 and the molding object 200, but for example, a fan which supplies air or gas like an inactive gas at a temperature lower than that of the molding object 200 to the molding object 200 and the mold 100 can be used. Moreover, substituting means which substitutes gas in the pressurizing chamber 12 with a cooling gas may be used. Furthermore, a cooling path formed of a metal with high thermal conductivity, such as aluminum or copper, may be formed in the stage 11, and a coolant like water or oil, or, a cooling gas like an inactive gas may be allowed to flow through the interior of the cooling path.

As the molding object 200, various kinds of materials can be used as far as it can deform in accordance with the shape of the mold 100 or the like at a molding temperature by pressure from the pressurizing chamber 12 side. Examples of such material are resins, such as polycarbonate, polyimide, polytetrafluoroethylene (PTFE), polyethylene, polystyrene, polypropylene, paraffin, and a cyclic-olefin-based thermoplastic resin, and, a metal like aluminum. If such a material is a thermoplastic material, a material in an arbitrary shape, such as tabular, a sheet, or a film can be used appropriately. It is appropriate if the thermoplastic material having a thickness of equal to 1 mm or less is used in order to accomplish the effect of the present invention, in particular, a sheet film having a thickness of equal to 500 μm or less is preferable, and the thinner the film thickness becomes like 200 μm, 100 μm, and 50 μm, the more the effect of the present invention can be accomplished remarkably.

The mold 100 is formed of, for example, "a metal like nickel", "ceramic", "a carbon material like glass-like carbon", or "silicon", and has a predetermined pattern formed in one end face (molding face). This pattern can be formed by precision machining performed on the molding face. Moreover, such pattern can be formed by semiconductor microfabrication technologies like etching performed on a silicon substrate, or by forming a metallic plating on a surface of the silicon substrate or the like by electroforming, e.g., nickel plating, and by peeling the metallic plating layer. Furthermore, such pattern can be formed by imprinting technologies like a film mold 100 to be discussed later. Needless to say, the material and the production technique of the mold 100 are not limited to any particular ones as far as a fine pattern can be formed. The width of the pattern (the size of the molding face in the planar direction) depends on the kind of the molding object 200 to be used, but is formed in various sizes, such as equal to 100 μm or smaller, equal to 10 μm or smaller, equal to 2 μm or smaller, equal to 1 μm or smaller, equal to 100 μm or smaller, and equal to 10 nm or smaller. Moreover, the depth (the size in a direction orthogonal to the molding face 100a) of such a pattern is formed in various sizes, such as equal to 10 nm or larger, equal to 100 nm or larger, equal to 200 nm or larger, equal to 500 nm or larger, equal to 1 μm or larger, equal to 10 μm or larger, and equal to 100 μm or larger. Furthermore, the pattern can have various aspect ratios, such as equal to 0.2 or larger, equal to 0.5 or larger, equal to 1 or larger, and equal to 2 or larger.

Because the mold 100 is heated and cooled during an imprinting process, it is preferable that the mold should be made thin as much as possible in order to make the thermal capacity small.

Next, an explanation will be given of an imprinting method of transferring a pattern on the mold 100 to a film molding object 200.

<Step 1>

Figure 3:
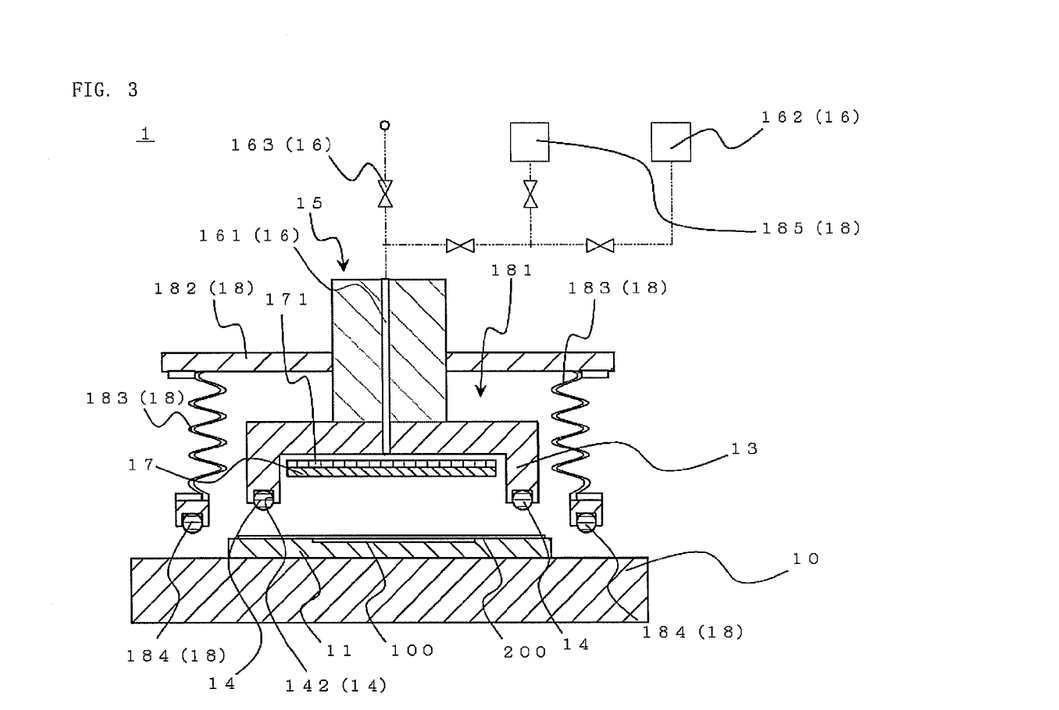
FIG. 3 is a schematic cross-sectional view showing a condition in which a pressurizing chamber and the vacuum chamber are opened.

The mold 100 having a pattern that is an inverted pattern to be transferred to the molding object 200 is prepared, and fixed on the stage 11. The film molding object 200 is arranged on the mold 100 (see FIG. 3).

<Step 2>

Gases present between the mold 100 and the molding object 200 are eliminated by the degassing means 18. For example, with the pressurizing chamber 12 being opened, the seal member of the bellows 183 is caused to abut the base 10 to form the vacuum chamber 181 (see FIG. 2). Air in the vacuum chamber 181 is evacuated through the pressurizing-chamber inlet/outlet path 161 provided in the pressurizing chamber 12 by the vacuum pump. Note that the seal member is caused to abut the base 10 by the elastic force of the bellows, but may be fixed to the base by additional fixing means.

<Step 3>

The pressurizing-chamber casing 13 is moved to the molding object 200 side by the opening/closing means 15, and the O-ring (the sealing means 14) is caused to abut the molding object, thereby configuring the pressurizing chamber 12 (see FIG. 1).

<Step 4>

The interior of the pressurizing chamber 12 is pressurized by the pressurizing means 16, and the molding object 200 is pressed against the mold 100.

<Step 5>

The mold 100 or the molding object 200 is heated by the heating means 17 equal to or higher temperature that enables the molding object 200 to do fluid migration (e.g., the glass transition temperature of the resin). For example, using a far-infrared heater provided at the ceiling of the pressurizing-chamber casing 13, the mold 100 or the molding object 200 is directly heated. Note that the explanation was given of a case in which heating is performed after pressurizing, but the order of step 4 and step 5 may be inverted, and pressurizing may be carried out after heating.

<Step 6>

After a predetermined time is elapsed which is sufficient for transferring of the pattern on the mold 100 to the molding object 200, heating by the heating means 17 is terminated, and the molding object 200 is cooled by the cooling means.

<Step 7>

After the pressure of the interior of the pressurizing chamber 12 is reduced up to an atmospheric pressure, the pressurizing chamber 12 and the vacuum chamber 181 are opened, and the mold 100 is released from the molding object 200. When the cooling means which substitutes the gas in the pressurizing chamber 12 with a cooling gas is used, it is possible to carry out both cooling and pressure reduction simultaneously.

Accordingly, any excessive intervening member present between the mold 100 and the molding object 200 in the case of the conventional technologies can be eliminated, so that it becomes possible to uniformly apply pressure between the mold 100 and the molding object 200, and to carry out heating and cooling at a fast speed.

Second Embodiment

Figure 4:
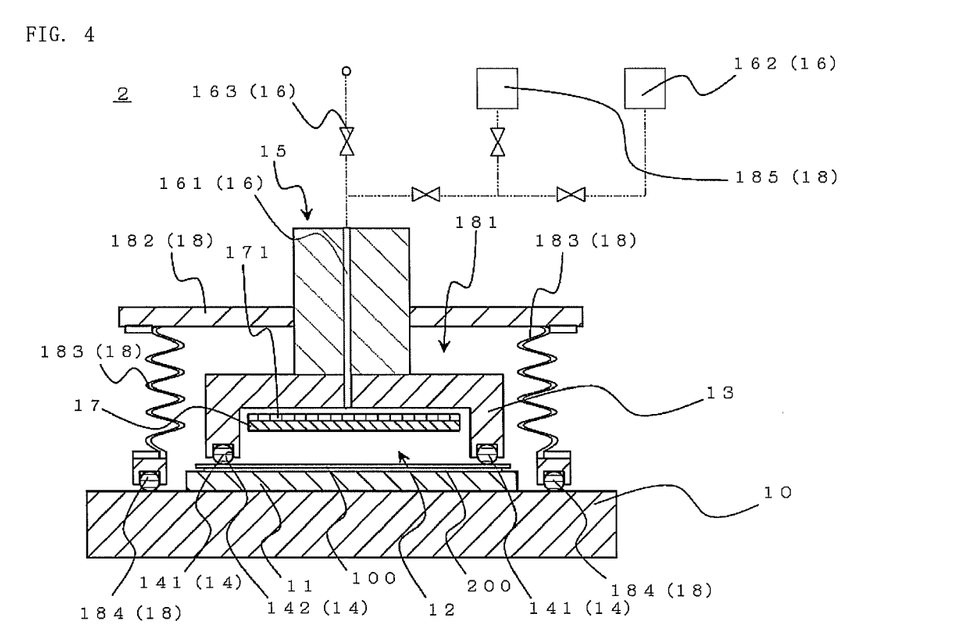
FIG. 4 is a schematic cross-sectional view showing a second imprinting device of the present invention.

As shown in FIG. 4, a second imprinting device 2 of the present invention is an imprinting device for transferring a pattern on a film mold 100 to a molding object 200, and mainly comprises a stage 11 which holds the molding object 200, a pressurizing-chamber casing 13 which configures a pressurizing chamber 12 together with the mold 100, sealing means 14 which airtightly seals a space between the pressurizing-chamber casing 13 and the mold 100, degassing means 18 which eliminates any gas present between the mold 100 and the molding object 200, opening/closing means 15 which opens/closes the space between the pressurizing-chamber casing 13 and the mold 100, heating means 17 which heats the molding object 200, and pressurizing means 16 which adjusts atmospheric pressure in the pressurizing chamber 12.

That is, the second imprinting device 2 of the present invention corresponds to the first imprinting device 1 of the present invention using the film mold 100 and swaps respective positions of the mold 100 and the molding object 200.

The stage 11 is not limited to any particular one as far as it can hold the molding object 200, but for example, a surface holding the molding object 200 is so formed as to be a larger plane than the molding object 200, or a recess having a depth substantially equal to the thickness of the molding object 200 and capable of retaining the molding object 200 thereinside is formed in such a plane. The material of the stage 11 is not limited to any particular one as far as it has pressure resistance and heat resistance so as to withstand pressure and heat at the time of molding, but it is preferable that a material having a similar thermal expansion coefficient to that of the molding object 200 should be used.

The pressurizing-chamber casing 13 is formed in a cylindrical shape with an opened face, and configures the pressurizing chamber 12 which is a sealed space as the opened face is closed by the mold 100. The opened face is so formed as to be larger than at least a pattern area to be transferred to the molding object 200. The material of the pressurizing-chamber casing 13 is not limited to any particular one as far as it has pressure resistance and heat resistance so as to withstand pressure and heat at the time of molding, and for example, an iron material like carbon steel or a metal like SUS can be used.

The sealing means 14 allows the pressurizing-chamber casing 13 and the mold 100 to airtightly contact with each other in order to make the pressurizing chamber 12 closed. For example, as shown in FIG. 4, an O-ring is prepared as the sealing means 14, a recessed groove shallower than the diameter of the cross section of the O-ring is formed in an end part of a side wall of the pressurizing-chamber casing 13, and the O-ring 141 is fitted into the groove. Accordingly, the mold 100 is held between the pressurizing-chamber casing 13 and the stage 11, and the pressurizing-chamber casing 13 and the mold 100 can airtightly contact with each other, so that the pressurizing chamber 12 can be airtightly closed. Moreover, even if there is an inclination between the pressurizing-chamber casing 13 and the mold 100, when such parallelism is within the collapsible range of the O-ring, the pressurizing chamber 12 can be surely closed.

The opening/closing means 15 opens/closes the pressurizing chamber 12 by causing the pressurizing-chamber casing 13 and the mold 100 to move close or to move apart relative to each other, and for example, a system having a hydraulic or pneumatic cylinder moving the pressurizing-chamber casing 13, or a system having an electric motor and a ball screw moving the pressurizing-chamber casing may be used.

The pressurizing means 16, the heating means 17, the degassing means 18, and the cooling means can employ the same structure as that of the foregoing first imprinting device, so that duplicated explanation thereof will be skipped in the present embodiment.

Figure 5:
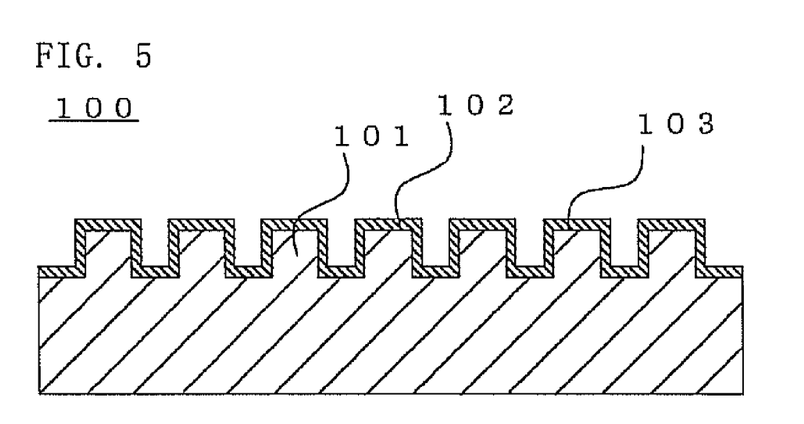
FIG. 5 is a schematic cross-sectional view showing a film-type mold of the imprinting device of the present invention.

Various kinds of mold 100 used for the imprinting device 2 can be used as far as it is a film which can deform in accordance with the shape of the molding object 200 by pressure from the pressurizing chamber 12 side, and for example, as shown in FIG. 5, one having a base layer 101 with a predetermined pattern 103 and a hard layer 102 formed on the pattern 103 can be used.

The base layer 101 is formed of a film of thermoplastic resin, such as cyclic-olefin-based resins, e.g., a cyclic-olefin ring-opening polymerization/hydrogenerated body (COP) and cyclic-olefin copolymer (COC), acrylic resins, and resins based on polycarbonate, vinyl-ether, perfluoroalkoxyalkane (PFA), polytetrafluoroethylene (PTFE), polystyrene, polyimide and the like. From the standpoint of dimensional stability of the pattern, it is preferable that the thermoplastic resin used for the base layer 101 should have a water absorption rate equal to 3% or less.

The base layer 101 has the predetermined pattern 103. Such pattern 103 can be formed through any technique, but for example, nanoimprinting technologies like thermal imprinting can be applied. The pattern 103 includes a geometric shape comprised of concavities and convexities, one for transferring a predetermined surface condition like transferring of a mirror-surface condition with predetermined surface roughness, and one for transferring an optical device like lens with predetermined curved surfaces.

The pattern 103 can be easily formed even if the minimum size of the width of a convex and the width of a concavity is equal to 100 μm or smaller. The width of the pattern 103 (the size in the planar direction) is formed in various sizes depending on the kind of the molding object 200 to be used, such as equal to 100 μm or smaller, equal to 10 μm or smaller, equal to 2 μm or smaller, equal to 1 μm or smaller, equal to 100 nm or smaller, and equal to 10 nm or smaller.

Moreover, the size of the pattern 103 in the depth direction is formed in various sizes, such as equal to 10 nm or larger, equal to 100 nm or larger, equal to 200 nm or larger, equal to 500 nm or larger, equal to 1 μm or larger, equal to 10 μm or larger, and equal to 100 μm or larger. Furthermore, the aspect ratio of the pattern 103 is set to be various ratios, such as equal to 0.2 or larger, equal to 0.5 or larger, equal to 1 or larger, and equal to 2 or larger.

The base layer 101 is so formed as to have a thickness which enables the base layer 101 to deform in accordance with the shape or the like of the molding object 200 by pressure from the pressurizing chamber 12 side at a molding temperature.

Because the mold 100 is heated and cooled during an imprinting process, it is preferable that the mold should be made thin as much as possible in order to make the thermal capacity small. For example, the mold is formed in a size equal to 50 μm or smaller, preferably, equal to 100 μm or smaller, but the size of the mold is not limited to those example sizes.

The hard layer 102 is formed of a material harder than the thermoplastic resin used for the base layer 101 when the mold 100 is heated to a molding temperature for thermal imprinting and pressed against the molding object 200. In consideration of the molding temperature in thermal imprinting, it is preferable that a material harder than the thermoplastic resin used for the base layer 101 at least within a range from equal to 0° C. or higher to equal to 100° C. or lower should be used. Examples of such material are a metal and an inorganic material which are solid substances at least within a range from equal to 0° C. or higher to equal to 100° C. or lower. For example, a metal or a metal compound, such as platinum (Pt), nickel (Ni), palladium, ruthenium, gold, silver, copper, ZnO, or indium tin oxide (ITO), or, an inorganic material like Si or SiO$_2$ can be used. Needless to say, other materials, e.g., a fluorine-based resin which is a harder material than the base layer 101 at least within a range from equal to 0° C. or higher to equal to 100° C. or lower can be used. Regarding the hardness, for example, it is appropriate if Vickers hardness or Brinell hardness is compared using a high-temperature hardness tester or the like. Such hardness can be checked by a test through nano-indentation.

If the thickness of the hard layer 102 is too thick, the pattern 103 of the base layer 101 is buried, so that it is preferable that the hard layer should be made thin as much as possible within a range in which the strength can be ensured, and for example, is formed in a size equal to 100 nm or smaller. The hard layer 102 can be formed of plural layers made of different materials in accordance with its application.

How to form the hard layer 102 is not limited to any particular technique, but for example, the foregoing material can be deposited through chemical vapor deposition (CVD), physical vapor deposition (PVD), or plating. For example, a metal like platinum (Pt) or nickel (Ni) can be formed by sputtering or vapor deposition. Moreover, the hard layer can be formed by silver mirror reaction. When a fluorine-based resin is used, a solution in which the material is dissolved can be dropped onto the pattern 103 of the base layer 101 by spin coating, or the base layer 101 can be dipped in the solution in which the material is dissolved.

Various kinds of molding object 200 can be used, and for example, resins, such as polycarbonate, polyimide, polytetrafluoroethylene (PTFE), polyethylene, polystyrene, polypropylene, paraffin, and a cyclic-olefin-based thermoplastic resin can be used. The molding object 200 in various shapes, such as a film, a substrate, or a thin film formed on a substrate, can be used.

Next, an explanation will be given of an imprinting method of transferring a pattern on the film mold 100 to the molding object 200.

<Step 1>

The molding object 200 is prepared and fixed on the stage 11. The film mold 100 having a pattern that is an inverted pattern to be transferred to the molding object 200 is arranged on the molding object 200.

<Step 2>

Gases present between the mold 100 and the molding object 200 are eliminated by the degassing means 18. For example, with the pressurizing chamber 12 being opened, the seal member of the bellows 183 is caused to abut the base 10 to form the vacuum chamber 181. Air in the vacuum chamber 181 is evacuated through the pressurizing-chamber inlet/outlet path 161 provided in the pressurizing chamber 12 by the vacuum pump. Note that the seal member is caused to abut the base 10 by the elastic force of the bellows, but may be fixed to the base by additional fixing means.

<Step 3>

The pressurizing-chamber casing 13 is moved to the mold 100 side by the opening/closing means 15, and the O-ring (the sealing means 14) is caused to abut the mold 100, thereby configuring the pressurizing chamber 12 (see FIG. 4).

<Step 4>

The interior of the pressurizing chamber 12 is pressurized by the pressurizing means 16, and the mold 100 is pressed against the molding object 200.

<Step 5>

The molding object 200 is heated by the heating means 17 equal to or higher temperature that enables the molding object 200 to do fluid migration (e.g., the glass transition temperature of the resin). For example, using a far-infrared heater provided at the ceiling of the pressurizing-chamber casing 13, the mold 100 or the molding object 200 is directly heated. Note that the explanation was given of a case in which heating is performed after pressurizing, but the order of step 4 and step 5 may be inverted, and pressurizing may be carried out after heating.

<Step 6>

After a predetermined time is elapsed which is sufficient for transferring of the pattern on the mold 100 to the molding object 200, heating by the heating means 17 is terminated, and the molding object 200 is cooled by the cooling means.

<Step 7>

After the pressure of the interior of the pressurizing chamber 12 is reduced up to an atmospheric pressure, the pressurizing chamber 12 and the vacuum chamber 181 are opened, and the molding object 200 is released from the mold 100. When the cooling means which substitutes the gas in the pressurizing chamber 12 with a cooling gas is used, it is possible to carry out both cooling and pressure reduction simultaneously.

Accordingly, any excessive intervening member present between the mold 100 and the molding object 200 in the case of the conventional technologies can be eliminated, so that it becomes possible to uniformly apply pressure between the mold 100 and the molding object 200, and to carry out heating and cooling at a fast speed. Moreover, a pattern can be transferred even if the molding object 200 is a substrate-like material.

The invention claimed is:

1. An imprinting device which transfers a pattern on a mold to a film molding object, the imprinting device comprising:
   a stage for holding the mold;
   a pressurizing-chamber casing which configures a pressurizing chamber together with the molding object;
   sealing means which airtightly seals a space between the pressurizing-chamber casing and the molding object;
   opening and closing means which opens and closes the space between the pressurizing-chamber casing and the molding object;
   pressurizing means which adjusts atmospheric pressure in the pressurizing-chamber;
   heating means which heats either one of or both of the mold and the molding object; and
   degassing means which includes a vacuum chamber where the mold and the molding object are arranged, and which eliminates a gas present between the mold and the molding object by reducing a pressure inside the vacuum chamber before the mold and the molding object are pressed.

2. An imprinting device which transfers a pattern on a film mold to a molding object, the imprinting device comprising:
   a stage for holding the molding object;
   a pressurizing-chamber casing which configures a pressurizing chamber together with the mold;
   sealing means which air-tightly seals a space between the pressurizing-chamber casing and the mold;
   opening and closing means which opens and closes the space between the pressurizing-chamber casing and the mold;
   pressurizing means which adjusts atmospheric pressure in the pressurizing-chamber;
   heating means which heats either one of or both of the mold and the molding object and
   degassing means which includes a vacuum chamber where the mold and the molding object are arranged, and which eliminates a gas present between the mold and the molding object by reducing a pressure inside the vacuum chamber before the mold and the molding object are pressed.

3. The imprinting device according to claim 1, wherein the heating means is provided inside the pressurizing-chamber and performs heating by irradiation of electromagnetic waves.

4. The imprinting device according to claim 1, wherein the heating means supplies a gas heated at a predetermined temperature into the pressurizing-chamber.

5. The imprinting device according to claim 1, further comprising cooling means which cools the molding object.

6. The imprinting device according to claim 2, wherein the mold is a film mold used at a predetermined molding temperature, the film mold comprising a base layer formed of a thermoplastic resin and having a predetermined pattern, and a hard layer formed on the pattern to have a thickness so that the pattern is not buried.

* * * * *